United States Patent
Theuss et al.

(10) Patent No.: US 8,482,135 B2
(45) Date of Patent: Jul. 9, 2013

(54) METHOD FOR PRODUCING A COMPONENT AND DEVICE HAVING A COMPONENT

(75) Inventors: Horst Theuss, Wenzenbach (DE); Albert Auburger, Regenstauf (DE); Jochen Dangelmaier, Beratzhausen (DE); Josef Hirtreiter, Viechtach (DE)

(73) Assignee: Infineon Technologies AG, Neubiberg (DE)

( * ) Notice: Subject to any disclaimer, the term of this patent is extended or adjusted under 35 U.S.C. 154(b) by 1190 days.

(21) Appl. No.: 11/770,836

(22) Filed: Jun. 29, 2007

(65) Prior Publication Data

US 2008/0036099 A1 Feb. 14, 2008

(30) Foreign Application Priority Data

Jul. 3, 2006 (DE) .......................... 10 2006 030 581

(51) Int. Cl.
*H01L 23/48* (2006.01)

(52) U.S. Cl.
USPC ........... 257/782; 257/787; 438/106; 438/107; 438/110; 438/125; 438/127

(58) Field of Classification Search
USPC .................................. 257/782, 787
See application file for complete search history.

(56) References Cited

U.S. PATENT DOCUMENTS

| | | | |
|---|---|---|---|
| 4,767,049 A | 8/1988 | Butt et al. | |
| 6,288,905 B1 * | 9/2001 | Chung | 361/771 |
| 6,429,508 B1 * | 8/2002 | Gang | 257/678 |
| 6,969,905 B2 | 11/2005 | Paulus | |
| 2002/0076852 A1 * | 6/2002 | Paulus et al. | 438/110 |
| 2004/0017000 A1 | 1/2004 | Chiu et al. | |
| 2004/0151014 A1 * | 8/2004 | Speakman | 365/49 |
| 2004/0156639 A1 | 8/2004 | Schunk et al. | |
| 2004/0213994 A1 * | 10/2004 | Kozakai et al. | 428/354 |
| 2007/0254402 A1 * | 11/2007 | Dimmler et al. | 438/99 |

FOREIGN PATENT DOCUMENTS

| | | |
|---|---|---|
| DE | 10031204 | 1/2002 |
| DE | 10047135 | 4/2002 |
| DE | 10144462 | 11/2002 |
| DE | 10146854 | 4/2003 |
| DE | 10228593 | 1/2004 |
| DE | 102004060922 | 9/2005 |
| DE | 102004046227 | 4/2006 |
| EP | 1179844 | 2/2002 |

OTHER PUBLICATIONS

"Fine-Line Conductor Manufacturing Using Drop-On-Demand PZT Printing Technology", John B. Szczech, et al., IEEE Transations on Electronics Packaging Manufacturing, vol. 25, No. 1, Jan. 2002.

* cited by examiner

*Primary Examiner* — Junghwa M Im
(74) *Attorney, Agent, or Firm* — Dicke, Billig & Czaja, PLLC

(57) ABSTRACT

A method for producing a component and device including a component is disclosed. A basic substrate having paper as substrate material is provided, at least one integrated circuit is applied to the basic substrate, the at least one integrated circuit applied on the basic substrate is enveloped with an encapsulant, and at least parts of the basic substrate are removed from the at least one enveloped integrated circuit.

23 Claims, 1 Drawing Sheet

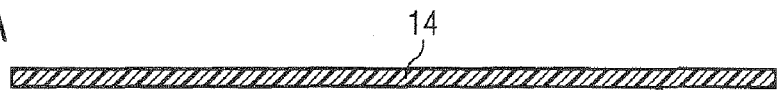
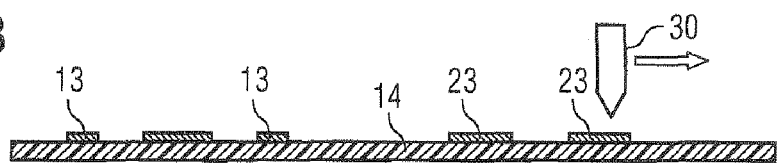
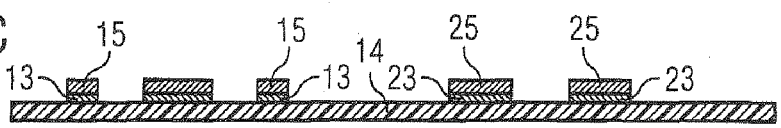
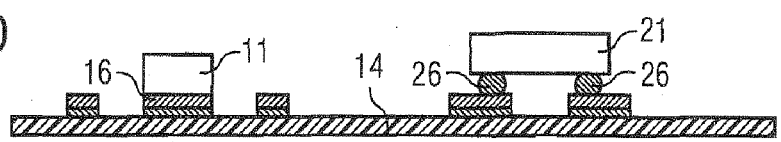
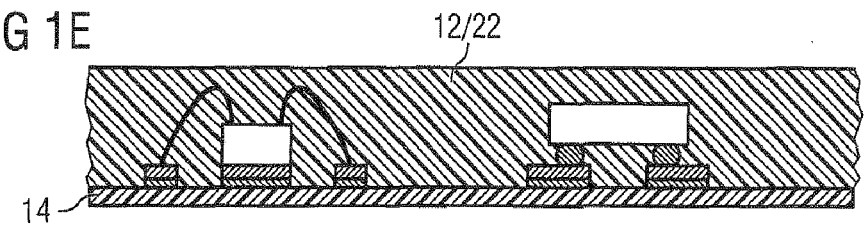
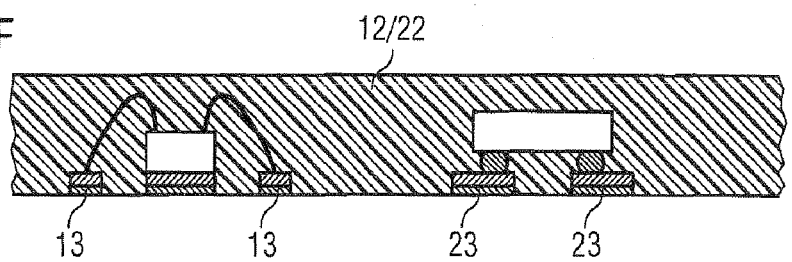
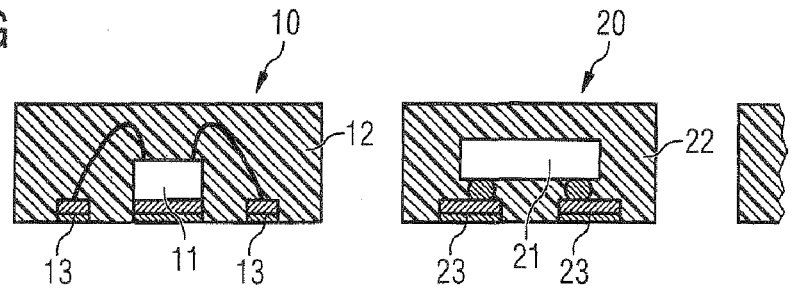

METHOD FOR PRODUCING A COMPONENT AND DEVICE HAVING A COMPONENT

CROSS-REFERENCE TO RELATED APPLICATIONS

This Utility Patent Application claims priority to German Patent Application No. DE 10 2006 030 581.7 filed on Jul. 3, 2006, which is incorporated herein by reference.

BACKGROUND

The invention relates to a method for producing a component and a device in which a component is arranged on a basic substrate.

Integrated circuits, after their production, are integrated into housings individually or with further integrated circuits and/or discrete circuit elements. For this purpose, the integrated circuits are enveloped with an encapsulant, for example in such a way that only external contact elements are externally accessible, via which electrical contact can be made with the integrated circuits. The components created by the enveloping are suitable for example for being mounted on printed circuit boards (PCB).

One embodiment specifies a cost-effective method for producing components. Furthermore, the intention is to provide a device including such a component.

In accordance with one embodiment, in a method for producing a component, the following processes are provided:
 providing a basic substrate, having paper as substrate material;
 applying at least one integrated circuit to the basic substrate;
 enveloping the at least one integrated circuit applied on the basic substrate with an encapsulant; and
 removing at least parts of the basic substrate from the at least one enveloped integrated circuit.

In accordance with a further embodiment, in a method for producing a component, the following processes are provided:
 providing a basic substrate, having at least one electrically insulating surface;
 applying electrically conductive external contact elements directly to the at least one electrically insulating surface of the basic substrate;
 applying at least one integrated circuit to the basic substrate;
 enveloping the at least one integrated circuit applied on the basic substrate with an encapsulant; and
 removing at least parts of the basic substrate from the at least one enveloped integrated circuit.

A further configuration of the invention provides for the external contact elements to be applied to the basic substrate by using an inkjet printing method.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1G illustrate a schematic illustration of two methods for producing a component as exemplary embodiments of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIGS. 1A to 1G schematically illustrate by way of example two methods for producing electronic components. The methods and devices shown therein serve as exemplary embodiments of the invention. The two methods illustrated on the left-hand and right-hand sides of FIG. 1 differ primarily in the fact that an integrated circuit is contact-connected by using a wire bonding technique in the method illustrated on the left-hand side of FIG. 1, while a flip-chip technology is used in the method shown on the right-hand side of FIG. 1. Since the two methods are otherwise identical in many respects, the sequence of the two methods is explained jointly hereinafter. Attention will be drawn to method processes in which the two methods differ.

The electronic components 10 and 20 produced by the two methods are illustrated schematically and in cross section in FIG. 1G. The components 10 and 20 respectively comprise an integrated circuit 11 and 21 enveloped by an encapsulant 12 and 22, respectively. Furthermore, the components 10 and 20 have external contact elements 13 and 23, respectively, which are electrically connected to contact pads of the integrated circuits 11 and 21, respectively. A respective surface of the external contact elements 13 and 23 is accessible from outside the components 10 and 20 and thus enables electrical contact to be made with the integrated circuits 11 and 21 that are enclosed, for example, completely by the encapsulant 12 and 22, respectively.

The components 10 and 20 do not have any pin connections, rather the surfaces of the external contact elements 13 and 23 that are provided for external contact-connection are arranged on a main area of the component 10 and 20 respectively. The surfaces of the external contact elements 13 and 23 that are provided for external contact-connection are formed essentially in planar fashion and terminate in flush fashion, for example, at the respectively adjoining surface of the encapsulant 12 and 22, respectively. Components of this type are referred to as "leadless components". With the latter it is possible to obtain a higher number of external contacts for the same area in comparison with the "leadframe components" which have pins for external contact-connection.

In order to produce the components 10 and 20, a basic substrate 14 is used—as shown in FIG. 1A—which has an essentially planar surface and is produced from paper, for example. The fibrous materials from which the paper was produced may be for example mechanical woodpulp or chemical pulp. Furthermore, it is possible to treat the paper in any regard and for example provide it with a coating.

The external contact elements 13 and 23 composed of electrically conductive material are applied on the basic substrate 14 produced from paper. An inkjet printing method, for example, can be used for this purpose. In this case, liquid droplets of the electrically conductive material are ejected from an opening of a nozzle of a print head 30, with the result that the droplets adhere on the basic substrate 14. The desired patterning of the external contact elements 13 and 23 can be obtained by the print head being correspondingly displaced by using suitable actuating elements.

Furthermore, it is also possible to use different deposition and patterning methods from the method shown in FIG. 1 for producing the external contact elements 13 and 23. By way of example, a photoresist layer can be applied to the basic substrate 14, which layer is patterned photolithographically. As an alternative, other material layers can be applied to the basic substrate 14 and be patterned, for example, by using plasma etching technology through a mask or by laser beam irradiation. By using the patterning surface regions of the basic substrate 14 are uncovered in the material layer applied on the basic substrate 14. The external contact elements 13 and 23 can be applied to the uncovered regions for example by vapour deposition of metal. Overgrowth of the metal beyond the patterned material layer gives rise to a mushroom-shaped cross section of the external contact elements 13 and 23. The layer applied for the patterning of the surface of the basic substrate 14 is removed again after the production of the external contact elements 13 and 23, so that only the external contact elements 13 and 23 remain on the basic substrate 14.

Furthermore, the external contact elements 13 and 23 can be reinforced for example in electroless fashion. By way of example, electrically conductive material, for example metal ions, can be deposited from a liquid on the external contact elements 13 and 23 produced by an inkjet printing method, for example. These additional reinforcement layers with which the external contact elements 13 and 23 produced by the inkjet printing method are coated are identified by the reference symbols 15 and 25, respectively, in FIG. 1C. As an alternative, a galvanic reinforcement is also conceivable by way of example. Examples of appropriate metals for the external contact elements 13 and 23 and the reinforcement layers 15 and 25, respectively, are gold, nickel, copper or palladium. Furthermore, the external contact elements 13 and 23 and also the reinforcement layers 15 and 25, respectively, can also be constructed from layers of different metals.

Instead of a material produced from paper, it is also possible for example to use a plastic film or an organic material as the basic substrate 14. By way of example, polyimide, polypropylene or polyethylene can be used as plastic. At least the surface of the plastic film or of the organic material on which the external contact elements 13 and 23 are arranged is electrically insulating or is coated with an electrically insulating layer. The external contact elements 13 and 23 are applied directly to the electrically insulating surface or layer, for example by one of the techniques described above, without prior additional application of an electrically conductive layer that covers the entire surface of the basic substrate 14 or at least regions of the surface on which no external contact elements 13 and 23 are arranged later.

If paper is used as substrate material, it is for example entirely conceivable, in contrast to a plastic film, to coat at least the surface of the paper substrate on which the external contact elements 13 and 23 are intended to be arranged with an electrically conductive layer prior to the application of the external contact elements 13 and 23. This makes it possible, for example, to utilize said layer as an electrode for an electrochemical reinforcement of the external contact elements 13 and 23. The electrically conductive layer may be a carbon or metal layer, for example.

In a further method step, illustrated in FIG. 1D, the integrated circuits 11 and 21 are applied to the basic substrate 14. In one embodiment illustrated on the left-hand side of FIG. 1, the integrated circuit 11 is for this purpose fixed on a bump 16 arranged on the basic substrate 14. The bump 16 can be produced, for example, in the same way as the external contact elements 13 and, if appropriate, the additional reinforcement layers 15. In this case, the integrated circuit 11 is oriented in such a way that its contact pads are uncovered and can be connected to the external contact elements 13 by using a wire bonding technique.

In one embodiment illustrated on the right-hand side of FIG. 1, the integrated circuit 21 is fixed on the basic substrate 14 in such a way that the surface of the integrated circuit 21 on which the contact pads are situated faces the basic substrate 14. The contact pads of the integrated circuit 21 are connected to the external contact elements 23 via electrically conductive bonding pumps 26 by using a flip-chip technology.

Furthermore, it is also possible, for example, to arrange discrete circuit elements and/or a plurality of integrated circuits 11 and 21 per component 10 and 20, respectively, on the basic substrate 14. If a component 10 and 20 is intended to comprise a plurality of integrated circuits 11 and 21, respectively, it is also possible to shape conductor tracks to which the integrated circuits 11 and 21, respectively, are connected.

In a further method process, illustrated in FIG. 1E, the integrated circuits 11 and 21 situated on the top side of the basic substrate 14 and the associated external contact elements 13 and 23, respectively, are enveloped with the encapsulant 12 and 22, respectively, by encapsulation by injection moulding. It would also be conceivable, of course, to provide each individual integrated circuit 11 and 21 with a separate enveloping. A plastics composition, for example, can be used as encapsulant 12 and 22.

In a further method process, illustrated in FIG. 1F, the basic substrate 14 is stripped from the integrated circuits 11 and 21 enveloped with the encapsulant 12 and 22, respectively, whereby a respective surface of the external contact elements 13 and 23 is uncovered. The basic substrate 14 can be removed, for example by pulling off, washing away, grinding or etching of the basic substrate 14. If paper was used as the basic substrate 14, and this was coated with a continuous electrically conductive layer prior to the application of the external contact elements 13 and 23, this layer is likewise removed.

In a further method process, illustrated in FIG. 1G, the components 10 and 20 are singulated for example by sawing or cutting.

One advantage of the production methods shown in FIG. 1 is that a very cost-effective material such as, for example, paper or plastic film or an organic material is used as the basic substrate 14. When selecting the material and when carrying out the method processes care must be taken to ensure that the substrate material selected is sufficiently stable at the process temperatures required. By way of example, the individual method processes such as, for example, the fitting of the wire connections are carried out, as far as possible, at lower temperatures.

Furthermore, the use of paper or plastic films or flexible organic materials as substrate material is advantageous insofar as the flexibility of these materials enables cost-effective production in a continuous strip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a component comprising:
   providing a basic substrate, having paper as substrate material;
   coating a surface of the basic substrate with an electrically conductive layer;
   applying electrically conductive external contact elements to the electrically conductive layer by an inkjet printing method;
   applying at least one integrated circuit to the basic substrate;
   electrically connecting the external contact elements to contact pads of the at least one integrated circuit;
   enveloping the at least one integrated circuit applied on the basic substrate with an encapsulant; and
   removing at least parts of the basic substrate from the at least one enveloped integrated circuit.

2. The method of claim 1, comprising reinforcing the external contact elements by electroless deposition of electrically conductive material.

3. The method of claim 1, wherein the removal of at least parts of the basic substrate from the at least one enveloped integrated circuit by washing away is provided.

4. The method of claim 1, comprising removing the electrically conductive layer after removing at least parts of the basic substrate.

5. The method of claim 4, wherein, after the removal of the electrically conductive layer, parts of the external contact elements are externally accessible.

6. The method of claim 1, wherein the electrically conductive layer comprises carbon.

7. The method of claim 1, wherein the electrically conductive layer comprises a metal.

8. A method for producing a component comprising:
   providing a basic substrate, having at least one electrically insulating surface;
   coating the surface of the basic substrate with an electrically conductive layer;
   applying electrically conductive external contact elements to the electrically conductive layer by an inkjet printing method;
   applying at least one integrated circuit to the basic substrate;
   enveloping the at least one integrated circuit applied on the basic substrate with an encapsulant; and
   washing away at least parts of the basic substrate from the at least one enveloped integrated circuit.

9. The method of claim 8, wherein the basic substrate has paper or plastic or an organic material as substrate material.

10. The method of claim 8, wherein the at least one electrically insulating surface is non-metallic.

11. The method of claim 8, comprising reinforcing the external contact elements by electroless deposition of electrically conductive material.

12. The method of claim 8, comprising removing the electrically conductive layer after washing away at least parts of the basic substrate.

13. The method of claim 12, wherein, after the removal of the electrically conductive layer, parts of the external contact elements are externally accessible.

14. The method of claim 8, wherein the electrically conductive layer comprises carbon.

15. The method of claim 8, wherein the electrically conductive layer comprises a metal.

16. A method for producing a component comprising:
    providing a basic substrate, having paper as substrate material;
    coating a surface of the basic substrate with an electrically conductive layer;
    applying at least one integrated circuit to the basic substrate;
    enveloping the at least one integrated circuit applied on the basic substrate with an encapsulant;
    removing at least parts of the basic substrate from the at least one enveloped integrated circuit; and
    removing the electrically conductive layer.

17. The method of claim 16, comprising:
    applying electrically conductive external contact elements to the electrically conductive layer; and
    electrically connecting the external contact elements to contact pads of the at least one integrated circuit.

18. The method of claim 17, comprising applying the external contact elements to the electrically conductive layer by an inkjet printing method.

19. The method of claim 17, comprising reinforcing the external contact elements by electroless deposition of electrically conductive material.

20. The method of claim 17, wherein, after the removal of the electrically conductive layer, parts of the external contact elements are externally accessible.

21. The method of claim 16, wherein the removal of at least parts of the basic substrate from the at least one enveloped integrated circuit by pulling off or grinding or washing away or etching is provided.

22. The method of claim 16, wherein the electrically conductive layer comprises carbon.

23. The method of claim 16, wherein the electrically conductive layer comprises a metal.

* * * * *